United States Patent
Lewicki et al.

(10) Patent No.: US 6,724,594 B2
(45) Date of Patent: Apr. 20, 2004

(54) OVER VOLTAGE PROTECTION TEST MULTIPLEXER AND METHODS OF OPERATING THE SAME

(75) Inventors: Laurence D. Lewicki, Sunnyvale, CA (US); Manoj N. Rana, Union City, CA (US); Arlo Aude, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 264 days.

(21) Appl. No.: 09/742,037

(22) Filed: Dec. 20, 2000

(65) Prior Publication Data

US 2002/0075618 A1 Jun. 20, 2002

(51) Int. Cl.[7] .............................. H02H 3/20; H03B 1/00
(52) U.S. Cl. ....................... 361/91.1; 327/108
(58) Field of Search ........................ 361/90, 91.1, 92; 327/108, 112, 210

(56) References Cited

U.S. PATENT DOCUMENTS

| | | | | |
|---|---|---|---|---|
| 5,063,304 A | * | 11/1991 | Iyengar | 327/310 |
| 5,387,826 A | * | 2/1995 | Shay et al. | 326/21 |
| 5,406,140 A | * | 4/1995 | Wert et al. | 326/68 |
| 5,555,149 A | * | 9/1996 | Wert et al. | 361/18 |
| 5,864,245 A | * | 1/1999 | Watarai | 326/81 |
| 5,883,415 A | * | 3/1999 | Tsuboi | 257/355 |
| 5,929,667 A | * | 7/1999 | Abadeer et al. | 327/112 |
| 6,100,740 A | * | 8/2000 | Pascucci | 327/210 |
| 6,163,199 A | * | 12/2000 | Miske et al. | 327/434 |

* cited by examiner

Primary Examiner—Brian Sircus
Assistant Examiner—Danny Nguyen

(57) ABSTRACT

There is disclosed a test multiplexer having over voltage protection for use in integrated circuitry, along with methods of operating the same. An exemplary test multiplexer according to one embodiment of the present invention includes a plurality of MOSFET devices and over voltage protection circuitry. The plurality of MOSFET devices, including both p-type and n-type MOSFET devices, cooperate to pass an input signal to an output signal line of the test multiplexer while the test multiplexer is enabled. The over voltage protection circuitry is biased so that a difference between the input signal voltage and a bias voltage does not exceed breakdown when the test multiplexer is disabled. An important aspect hereof is that the test multiplexer is compliant to input voltages that exceed the positive supply rail, and is capable of sustaining a high or otherwise out of threshold single ended voltage at the input without latching up.

20 Claims, 4 Drawing Sheets

OVER VOLTAGE PROTECTION TEST MULTIPLEXER AND METHODS OF OPERATING THE SAME

TECHNICAL FIELD OF THE INVENTION

The present invention is generally directed to voltage protection devices and, more specifically, to the use of test multiplexers having over voltage protection and methods of operating the same in an integrated circuit.

BACKGROUND OF THE INVENTION

In microelectronic circuit design there is an increasing demand for low-power, low-voltage circuits. Complementary metal-oxide semiconductor (CMOS) devices operate at high switching speeds and with high packing densities, even with a comparatively low voltage power supply. However, device dimensions in integrated circuits are now becoming so small that their isolation barriers may break down at just a few volts.

CMOS integrated circuits use n-type and p-type metal oxide field effect transistors (MOSFET) that may have a gate, a drain, or a source terminal connected to a signal line driven by another circuit. A longstanding problem is that electrostatic discharges (or similar externally generated voltage transients) may break down the thin gate oxide of the CMOS transistor. Once the gate oxide has been damaged, the transistor may be useless. A similar problem may arise in systems using multiple voltage levels. In this case, not only is there a risk of electrostatic discharge but an overvoltage may occur in a low voltage circuit. An external signal line of the regulated lower voltage system may be coupled to a higher voltage pin. Under some operating conditions, "latch up" may occur. Consequently, there is a significant risk of damage to the low-voltage components in an integrated circuit due to an over-voltage condition.

A typical CMOS integrated circuit includes a test multiplexer (MUX) that may be engaged by program logic to test the operation of individual circuits within the CMOS integrated circuit. A typical CMOS integrated circuit may be set at Vcc/2(1.5 V) where Vcc is the supply voltage (typically 3 volts). Normally, a regular CMOS test MUX would serve the purpose of over-voltage protection because at no time would the signal at the source or drain of a p-type or n-type device in the test mux exceed the gate voltage by more than the breakdown threshold voltage. However, in certain types of CMOS circuits, peak voltage may be as high as five volts. At five volts, a p-type or n-type device on a CMOS test mux may easily latch up since the voltage difference between the gate and source, the gate and drain, or the gate and bulk would be five volts, which is greater than the breakdown voltage.

There is therefore a need in the art for an over-voltage protection circuit that does not latch up in response to input over-voltages.

SUMMARY OF THE INVENTION

To address the above-discussed deficiencies of the prior art, it is a primary object of the present invention to provide a test multiplexer having (i) a plurality of MOSFET devices that cooperate to pass an input signal to an output signal line when the test multiplexer is enabled, and (ii) over voltage protection circuitry that is biased so that a difference between the input signal voltage and a bias voltage does not exceed breakdown when the test multiplexer is disabled.

According to one advantageous embodiment, the plurality of MOSFET devices comprises at least one p-type MOSFET device and at least one n-type MOSFET device, and the over voltage protection circuitry comprises a bias circuit. When the test multiplexer is enabled (i.e., during "test mode"), the p-type and n-type MOSFET devices cooperate to pass a first input signal to an output signal line of the test multiplexer.

In contrast, when the test multiplexer is disabled (i.e., "off mode"), the bias circuit of the over voltage protection circuitry operates to generate a reference voltage that is not more than a breakdown threshold voltage, $V_t$, below a maximum signal level on the first signal line. This reference voltage is applied to at least one of a gate, a drain, a source and a bulk connection of the at least one p-type MOSFET device such that none of a first voltage difference between the gate and the drain, a second voltage difference between the gate and the source, and a third voltage difference between the gate and the bulk connection is greater than the breakdown threshold voltage, $V_t$.

According to a related embodiment, the reference voltage is further applied to at least one of another gate, another drain, another source and another bulk connection of the at least one n-type MOSFET device such that none of a first voltage difference between the another gate and the another drain, a second voltage difference between the another gate and the another source, and a third voltage difference between the another gate and the another bulk connection is greater than the breakdown threshold voltage, $V_t$.

An important aspect hereof is that the test multiplexer is operable to provide over-voltage protection that is compliant to input voltages that exceed the positive supply rail. In an exemplary embodiment discussed hereafter, the test multiplexer is composed of p-type and n-type MOSFET devices, wherein most of the p-type MOSFET devices are tied to source, and at least two n-type MOSFET devices are connected in series and biased so that terminal voltages do not exceed breakdown. This exemplary test multiplexer is capable of sustaining single ended voltages as high as five volts at an input signal line without latching up.

In another related embodiment, the over voltage protection circuitry of the test multiplexer is capable of sampling another input signal on an input signal line that one of enables and disables said test multiplexer. The bias circuit thereof is operable to generate a reference voltage that is not more than a breakdown threshold voltage, $V_t$, below a maximum signal level on the input signal line, the over voltage protection circuitry is further operable to disable the bias circuit in response to the sampled another input signal enabling the test multiplexer.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or, " is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Further definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document, are by way of illustration only and should not be construed to limit the scope of the invention. Those skilled in the art will understand that the principles of the present invention may be implemented in any suitably arranged integrated circuit.

Figure 1:
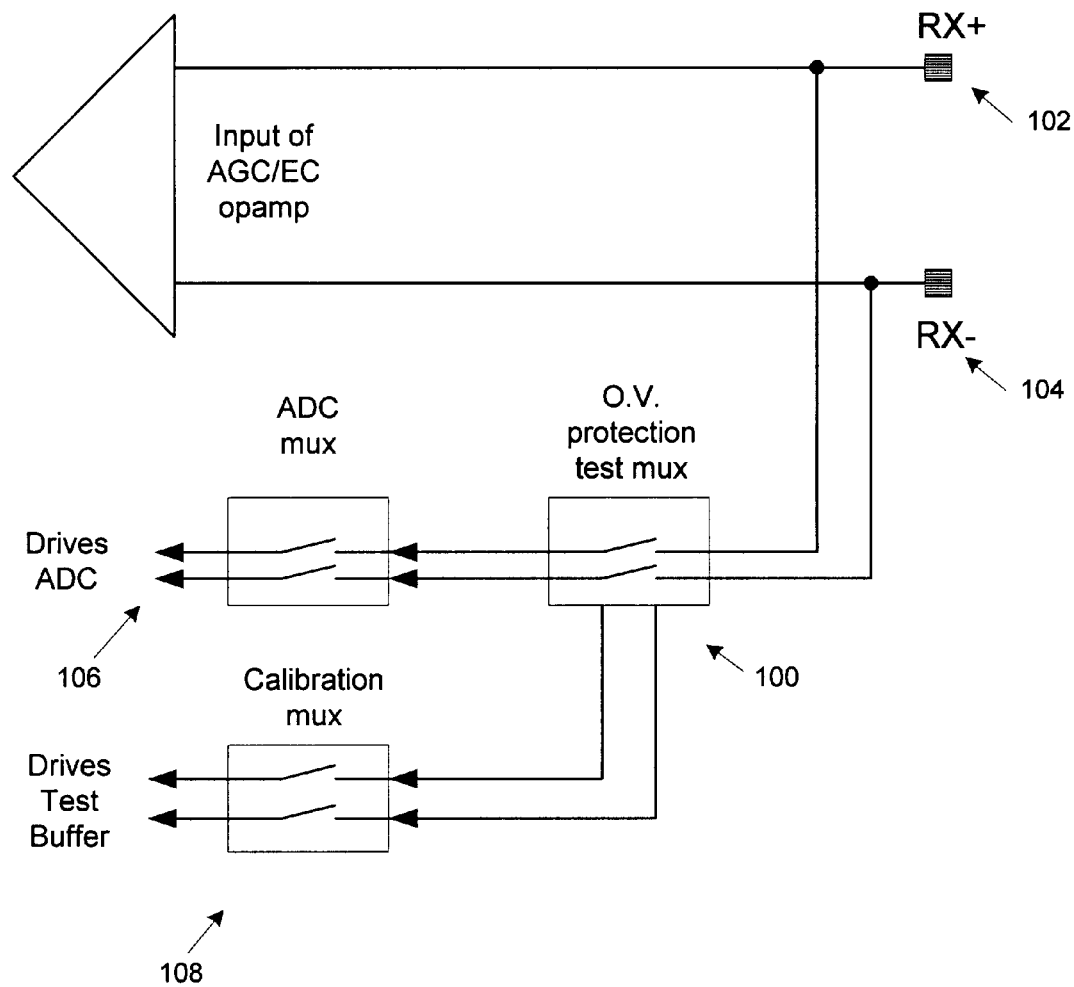
FIG. 1 illustrates a block diagram of an exemplary test multiplexer with over-voltage protection in accordance with the principles of the present invention.

Turning initially to FIG. 1, illustrated is a block diagram of an exemplary test multiplexer with over-voltage protection (generally designated 100) implemented in accordance with the principles of the present invention. Exemplary test multiplexer 100 is operable to pass an input signal to an output signal line when test multiplexer 100 is enabled, and is biased so that a difference between the input signal voltage and a bias voltage does not exceed breakdown when test multiplexer 100 is disabled.

According to this advantageous embodiment, test multiplexer 100 is illustratively connected to input terminal 102 (RX+) and input terminal 104 (RX−) and operates, in part, to detect any voltage present at input terminals 102 and 104. An important aspect of this embodiment is that test multiplexer 100 is operable to provide over-voltage protection that is compliant to input voltages that exceed the positive supply rail.

In one advantageous implementation, which is described in greater detail with reference to FIGS. 2 and 3, test multiplexer 100 is composed of p-type and n-type MOSFET devices. The sources of the p-type MOSFET devices are tied to the bulk contact, and at least two n-type MOSFET devices are connected in series and biased so that terminal voltages do not exceed breakdown. Test multiplexer 100 is capable of sustaining relatively high single ended voltages at an input signal line without latching up.

In operation, test multiplexer 100 may be in one of a disabled or an enabled status. When disabled, test multiplexer 100 is in "OFF" mode. When enabled, test multiplexer 100 is "test" mode. In test mode, test multiplexer 100 receives at input terminal 102 (RX+) and input terminal 104 (RX−) a 1.4 volt peak-to-peak signal at common mode voltage of Vcc/2 (typically, 1.5 V).

The output of test multiplexer 100 drives (i) analog to digital converter (ADC) multiplexer (generally designated 106) which in turn drives an ADC (not shown), and (ii) calibration multiplexer (generally designated 108), which in turn drives a test buffer (not shown). Either ADC multiplexer 106 is enabled for standalone ADC testing or calibration multiplexer 108 is enabled for calibrating the test buffer.

Figure 2:
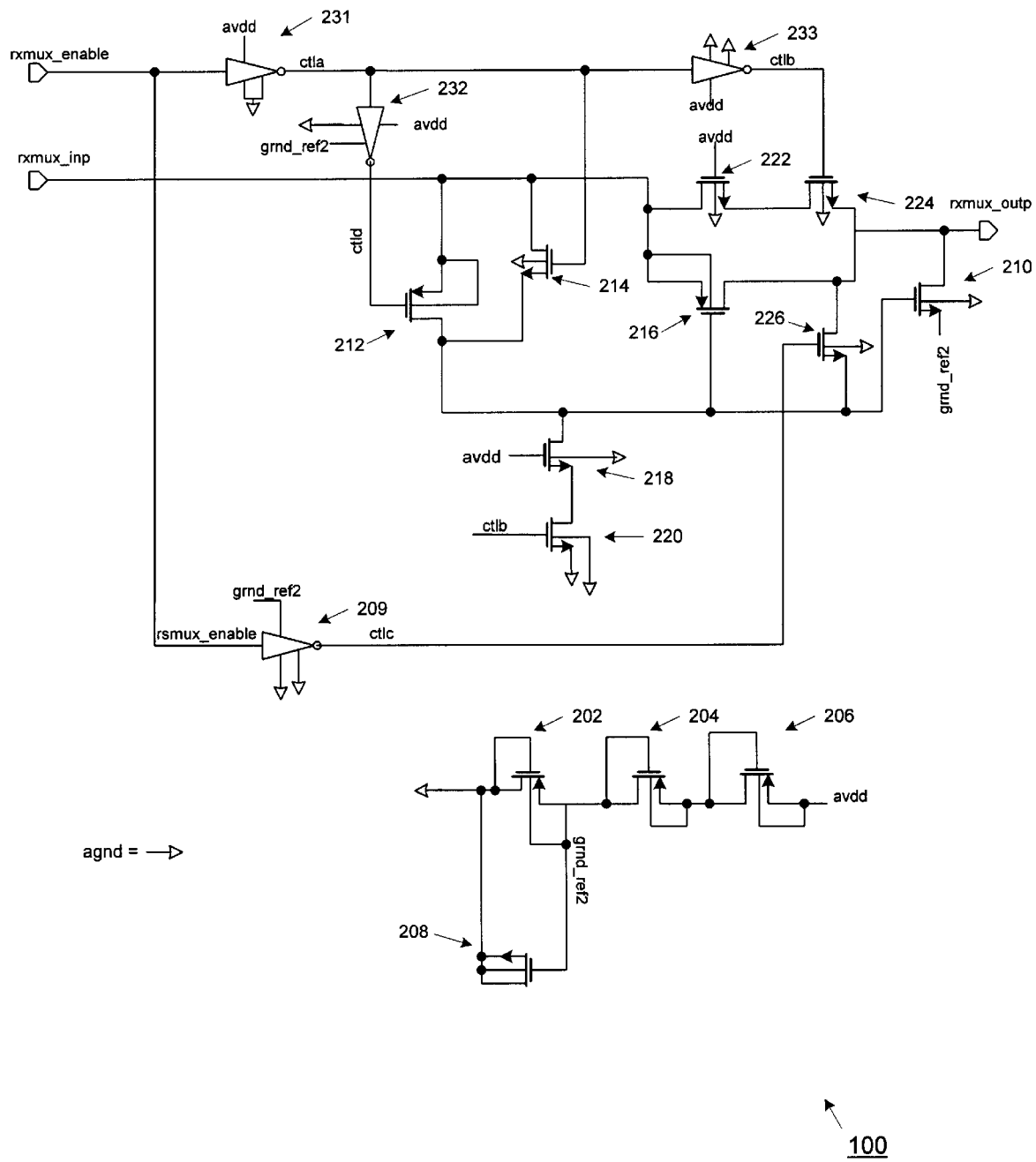
FIG. 2 illustrates exemplary circuitry implementing the exemplary test multiplexer with over-voltage protection of FIG. 1 in accordance with the principles of the present invention.

Turning next to FIG. 2, illustrated is exemplary circuitry implementing test multiplexer 100 with over-voltage protection of FIG. 1, all in accordance with the principles of the present invention. For purposes of illustration, concurrent reference is made to the description of the advantageous embodiment set forth with respect to FIG. 1.

Exemplary test multiplexer 100 illustrates a single ended circuit, shown for clarity, and includes (i) a plurality of MOSFET devices that cooperate to pass an input signal sampled from a first input signal line (i.e., rxmux_inp signal) to an output signal line (i.e., rxmux_outp signal) when the test multiplexer is enabled, and (ii) over voltage protection circuitry that is biased so that a difference between the input signal voltage and a bias voltage applied to selected terminals of the p-type and n-type MOSFETS does not exceed breakdown when test multiplexer 100 is disabled.

Test multiplexer 100 comprises a plurality of p-type MOSFET devices, namely, transistors 202, 204, 206, 212 and 216, and a plurality of n-type MOSFET devices, namely transistors 208, 210, 214, 218, 220, 222, 224 and 226. Test multiplexer 100 also comprises inverters 231, 232, 233 and inverter 209. P-type transistors 202, 204 and 206 are operable to generate the reference voltage level, gnd_ref2, an application-defined value that is ⅓ of Vcc (i.e., the power supply voltage). N-type transistor 208 operable as a MOSFET capacitor for filtering purposes. The gnd_ref2 reference voltage is coupled to the Vdd input of inverter 209, to the Vss input of inverter 232, and to the source of n-type transistor 210. Applying the gnd_ref2 reference voltage to the Vss supply of inverter 232 ensures that the output of inverter 232 (i.e., the ctld signal) does not fall below the level of the gnd_ref2 reference voltage. Applying the gnd_ref2 reference voltage to the Vdd supply of inverter 209 ensures that the output of inverter 209 (i.e., the ctlc signal) does not rise above the level of the gnd_ref2 reference voltage.

P-type transistor 212 and n-type transistor 214 are operable to function as a p-type/n-type multiplexer to ensure that, when the rxmux_enable signal is low (i.e., Logic 0), the gate of p-type transistor 216 is shorted to the source of p-type transistor 216, thereby ensuring that p-type transistor 216 does not turn on. When the rxmux_enable signal is high (i.e., Logic 1), both p-type transistor 212 and n-type transistor 214 are off. At that point, the gate of p-type transistor 216 is set low by n-type transistors 218 and 220. The output of inverter 233 (i.e., the ctlb signal) is high in this case and controls the gate of n-type transistor 220. N-type transistor 218 ensures that the drain to source voltage of n-type transistor 220 does not exceed threshold, which in the instant case is five volts.

N-type transistors 222 and 224 form a second side of test multiplexer 100, whereby n-type transistor 222 ensures that the drain to source voltage of n-type transistor 224 also does not exceed threshold, which in the instant case is again five volts. N-type transistors 226 and 210 are operable to strap the rxmux_outp output signal to either the input voltage or the gnd_ref2 reference voltage in OFF mode, whereas in test mode, n-type transistors 226 and 210 are disabled or turned off. In addition, inverters 231, 232, 233, and 209 are operable to provide a correct logic signal to control transistors 212, 214, 224, and 226.

In broad summary, the plurality of MOSFET devices comprises at least one p-type MOSFET device and at least one n-type MOSFET device, and the over voltage protection circuitry comprises a bias circuit. When the test multiplexer is enabled (i.e., during test mode), the p-type and n-type MOSFET devices cooperate to pass a first input signal to an output signal line of test multiplexer 100. In contrast, when test multiplexer 100 is disabled (i.e., OFF mode), the bias circuit of the over voltage protection circuitry operates to generate a reference voltage that is not more than a breakdown threshold voltage, $V_t$, below a maximum signal level on the first signal line. This reference voltage is applied to at least one of a gate, a drain, a source and a bulk connection of the at least one p-type MOSFET device or at least one n-type MOSFET device, such that none of a first voltage difference between the gate and the drain, a second voltage difference between the gate and the source, and a third voltage difference between the gate and the bulk connection is greater than the breakdown threshold voltage, $V_t$.

According to the illustrated embodiment, when the rxmux_enable signal is Logic 1, test multiplexer 100 is enabled and in test mode. P-type transistor 212 and n-type transistors 214, 226 and 210 are turned off, thereby enabling p-type transistor 216. N-type transistor 222 advantageously has its gate pulled to the supply level, avdd (e.g., three volts). N-type transistor 224 is turned on by asserting its gate voltage high (e.g., the ctlb signal is three volts), and the input is driven with a 1.4 Vpp signal with Vcm (common mode voltage) set to Vcc/2. Voltage at the output follows the input and appears at the rxmux_outp signal.

In contrast, when the rxmux_enable signal is Logic 0, test multiplexer 100 is disabled or in OFF mode. N-type transistors 218 and 220 are turned off, while p-type transistor 212 and n-type transistor 214 are turned on. The gate of p-type transistor 212 goes to the level of the gnd_ref2 reference signal (e.g., 1.1 V at Vcc equal to 3.3 V). The gate of n-type transistor 214 is pulled to analog ground (agnd) by the ctla signal from inverter 231.

When the rxmux_enable signal is low, n-type transistor 226 is on and shorts the rxmux_outp output line to the gate of n-type transistor 216. As the input starts going higher, n-type transistor 226 starts turning off and n-type transistor 210 starts turning on and strapping the output to the level of the gnd_ref2 reference signal.

Figure 3:
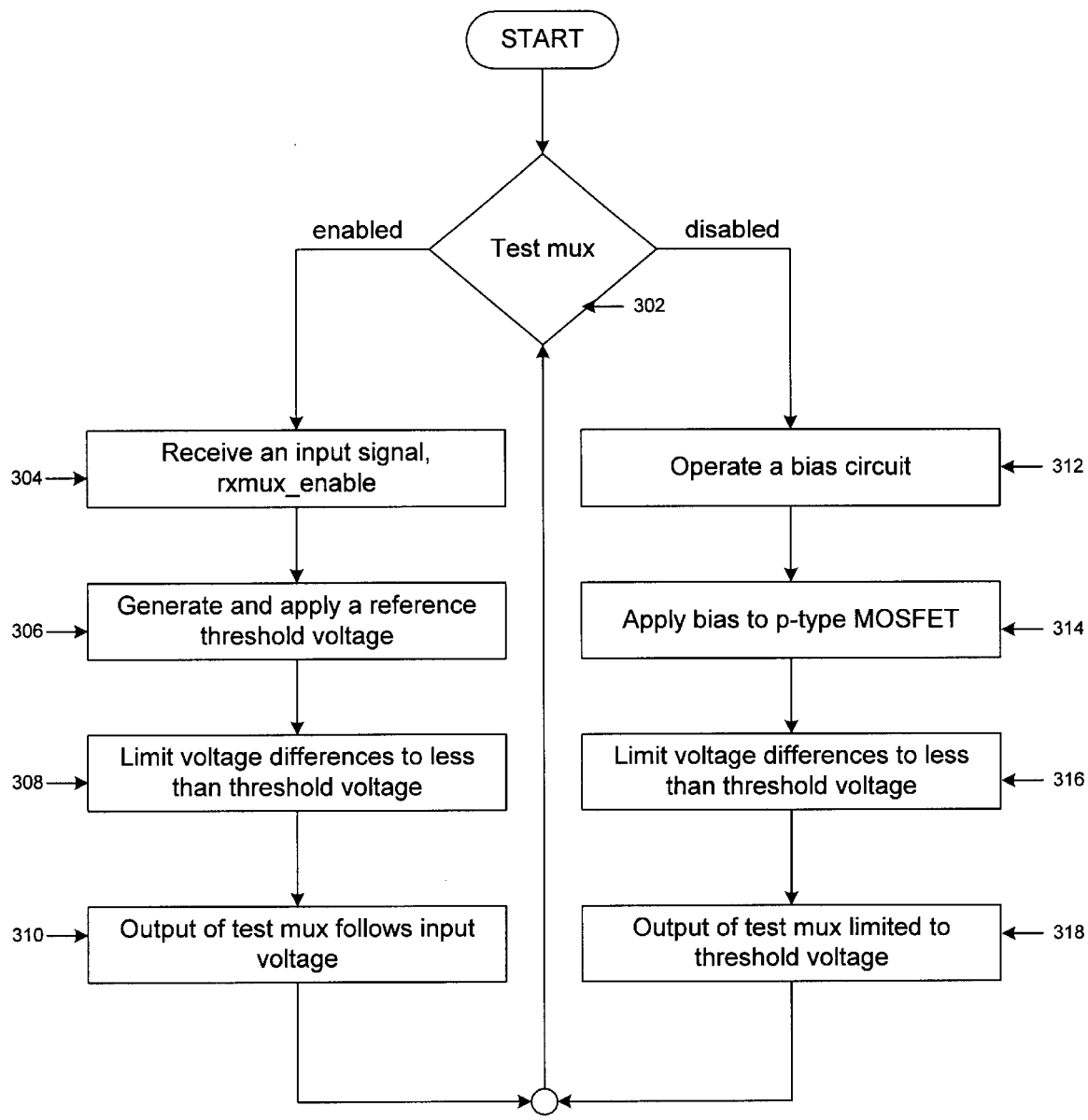
FIG. 3 illustrates a high-level flow diagram of a method of operating the exemplary test multiplexer with over-voltage protection of FIGS. 1 and 2, all in accordance with the principles of the present invention.

Turning next to FIG. 3, a high-level flow diagram is illustrated (generally designated 300) of one method of operating exemplary test multiplexer 100 with over-voltage protection of FIGS. 1 and 2, all in accordance with the principles of the present invention. For purposes of illustration, concurrent reference is made to the descriptions of the advantageous embodiments set forth with respect to FIGS. 1 and 2.

To begin, test multiplexer 100 is connected to input terminals of the protected device so that test multiplexer 100 sees whatever voltage is present at the input. The input signal is detected at the input terminals and a determination is made whether test multiplexer 100 is enabled (in test mode) or disabled (off) (process step 302).

If test multiplexer 100 is enabled, the rxmux_enable signal is received by test multiplexer 100. As discussed above, test multiplexer 100 utilizes both n-type and p-type MOSFET devices to provide over voltage protection. Further, p-type MOSFET devices are utilized to generate a reference voltage for limiting the maximum signal level on the input signal line. The reference voltage, gnd_ref2, is always one third of Vcc, the supply voltage (e.g., one volt when Vcc is three volts) (process step 304).

The reference voltage is applied to p-type MOSFET transistors as described earlier. Transistor 226 and transistor 210, both n-type MOSFET transistors, are used to strap the output to the input voltage in test mode. In test mode, transistors 210 and 226 are turned off (process step 306). The voltage difference between the gate and drain, the gate and source, and the gate and bulk of the p-type MOSFET transistor are not greater than a threshold voltage, $V_t$, which is the breakdown voltage of the device. The difference between the maximum input signal and the gnd_ref2 reference voltage is always less than $V_t$ (process step 308). The output of test multiplexer 100, rxmux_outp, follows the input voltage, but never exceeds the threshold voltage. The process then returns to step 302 (process step 310).

Returning to step 302, a determination is made whether test multiplexer 100 is enabled or disabled (process step 302). If test multiplexer 100 is disabled, any signal that is present on the input is passed to test multiplexer 100. However, p-type MOSFET devices are utilized to generate a reference voltage for limiting the maximum voltage level on the input signal line. As described above, the gnd_ref2 reference voltage is always one third of Vcc, the supply voltage (e.g., one volt when Vcc is three volts). Even though test multiplexer 100 is disabled, the difference between the maximum input signal and the gnd_ref2 signal is always less than $V_t$ (process step 312).

The gnd_ref2 signal is utilized to bias p-type MOSFET transistors in test multiplexer 100. Even if test multiplexer 100 is disabled, n-type and p-type MOSFET transistors in the circuit are provide over voltage protection for devices downstream of test multiplexer 100. It is during the disabled mode that the input voltage can be high enough to cause damage (process step 314). The voltage differences between the gate and drain, the gate and source, and the gate and bulk of the MOSFET transistors are not greater than $V_t$. The difference between the maximum input signal and the gnd_ref2 reference voltage is always less than the threshold voltage (process step 316). The output of test multiplexer 100, rxmux_outp, never exceeds the level of the gnd-ref2 reference voltage. The process then returns to step 302 (process step 318).

Figure 4:
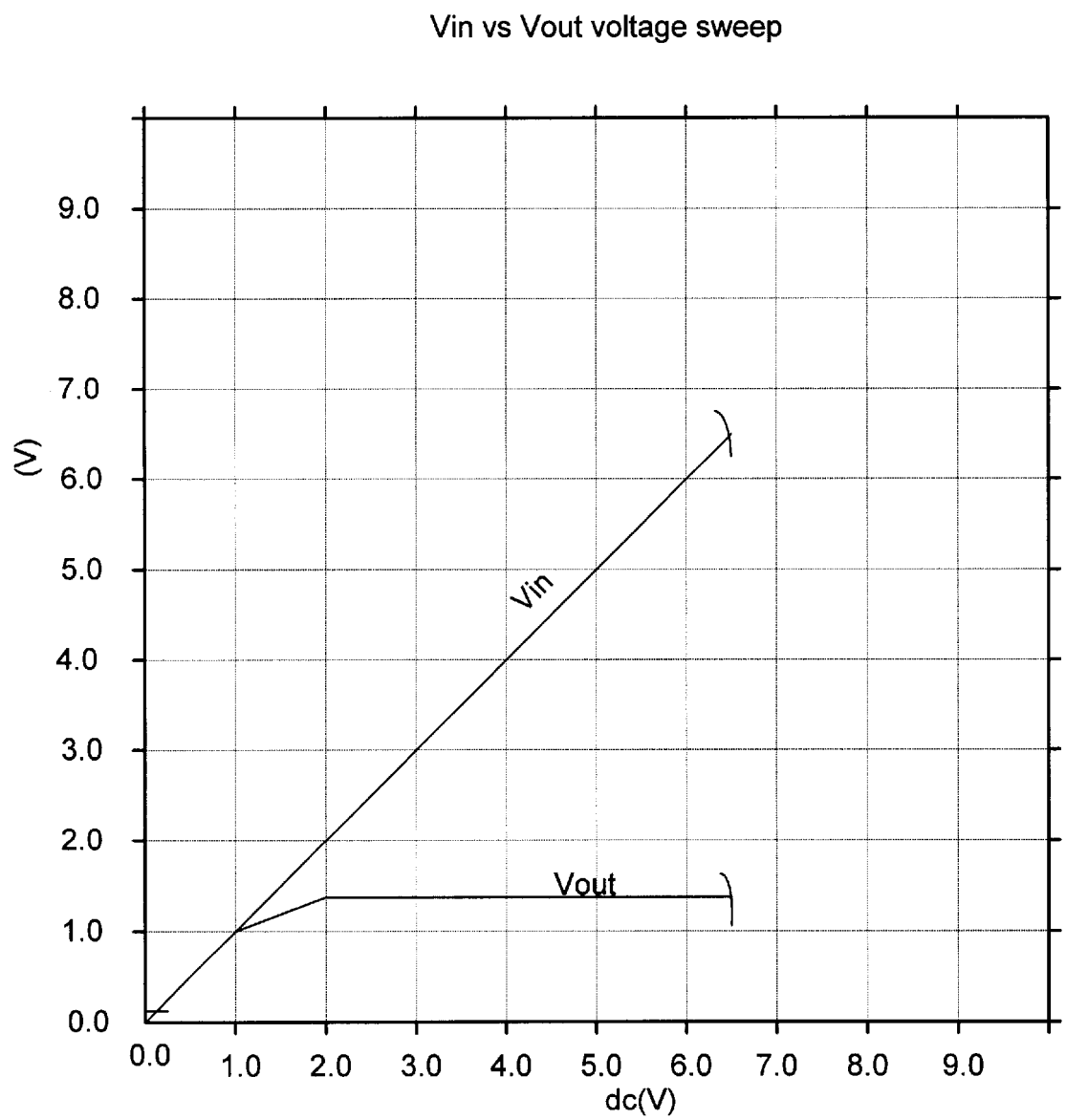
FIG. 4 illustrates a graphical illustration of the relationship of voltage input and voltage output in the exemplary test multiplexer with over-voltage protection of FIGS. 1 to 3, all in accordance with the principles of the present invention.

Turning next to FIG. 4, illustrated is a graphical illustration of the relationship of voltage input and voltage output in exemplary test multiplexer 100 with over-voltage protection of FIGS. 1 to 3, all in accordance with the principles of the present invention. For purposes of illustration, concurrent reference is made to the descriptions of the advantageous embodiments set forth with respect to FIGS. 1 to 3.

According to this exemplary illustration, the voltage input (Vin) is graphed from zero to six volts and the voltage output (Vout, the voltage appearing at rxmux_outp output) is shown following the injected 1.4 volts peak to peak signal voltage even though Vin continues to six volts. Exemplary test multiplexer 100 is operable to avoid latch up to high input voltages, whereby the core of test multiplexer 100 is a transmission gate formed by p-type and n-type MOSFET devices, which are suitably arranged to such that there is no latch up. Additionally, maximum ratings are maintained across all the transistors and there is no leakage when test multiplexer 100 is turned off.

As is evident from the foregoing, there is disclosed a test multiplexer having over voltage protection for use in integrated circuitry, along with methods of operating the same. An exemplary test multiplexer according to one embodiment of the present invention includes a plurality of MOSFET devices and over voltage protection circuitry. The plurality of MOSFET devices, including both p-type and n-type MOSFET devices, cooperate to pass an input signal to an output signal line of the test multiplexer while the test multiplexer is enabled. The over voltage protection circuitry is biased so that a difference between the input signal voltage and a bias voltage does not exceed breakdown when the test multiplexer is disabled. An important aspect hereof is that the test multiplexer is compliant to input voltages that exceed the positive supply rail, and is capable of sustaining a high or otherwise out of threshold single ended voltage at the input without latching up.

Although the present invention has been described in detail, those skilled in the art should understand that they can make various changes, substitutions and alterations herein without departing from the spirit and scope of the invention in its broadest form.

What is claimed is:

1. A test multiplexer having a plurality of MOSFET devices that cooperate to pass an input signal to an output signal line when said test multiplexer is enabled, and over voltage protection circuitry that is biased so that a difference between said input signal voltage and a bias voltage does not exceed breakdown when said test multiplexer is disabled.

2. The test multiplexer set forth in claim 1 wherein said plurality of MOSFET devices comprise at least one p-type MOSFET device and at least one n-type MOSFET device that cooperate to pass said input signal to said output signal line of said test multiplexer.

3. The test multiplexer set forth in claim 2 wherein said over voltage protection circuitry comprises a bias circuit that operates to generate a reference voltage that is not more than a breakdown threshold voltage, Vt, below a maximum signal level on an input signal line, wherein said reference voltage is applied to at least one of a gate, a drain, a source and a bulk connection of said at least one p-type MOSFET device such that none of a first voltage difference between said gate and said drain, a second voltage difference between said gate and said source, and a third voltage difference between said gate and said bulk connection is greater than said breakdown threshold voltage, Vt.

4. The test multiplexer set forth in claim 3 wherein said reference voltage is applied to at least one of another gate, another drain, another source and another bulk connection of said at least one n-type MOSFET device such that none of a first voltage difference between said another gate and said another drain, a second voltage difference between said another gate and said another source, and a third voltage difference between said another gate and said another bulk connection is greater than said breakdown threshold voltage, Vt.

5. The test multiplexer set forth in claim 1 wherein said over voltage protection circuitry comprises a plurality of p-type MOSFET devices connected in series.

6. The test multiplexer set forth in claim 1 wherein said over voltage protection circuitry is capable of sampling another input signal on an input signal line that one of enables and disables said test multiplexer.

7. The test multiplexer set forth in claim 6 wherein said over voltage protection circuitry comprises a bias circuit that operates to generate a reference voltage that is not more than a breakdown threshold voltage, Vt, below a maximum signal level on said input signal line, said over voltage protection circuitry is further operable to disable said bias circuit in response to said sampled another input signal enabling said test multiplexer.

8. A method of operating a test multiplexer for over voltage protection, said test multiplexer comprising a plurality of MOSFET devices and over voltage protection circuitry, said method comprising the steps of:

using said plurality of MOSFET devices, when said test multiplexer is enabled, to cooperatively pass an input signal sampled from an input signal line of said test multiplexer to an output signal line of said test multiplexer; and biasing said over voltage protection circuitry, when said test multiplexer is disabled, so that a difference between an input signal voltage and a bias voltage does not exceed breakdown.

9. The method of operating the test multiplexer for over voltage protection as set forth in claim 8 wherein said plurality of MOSFET devices comprise at least one p-type MOSFET device and at least one n-type MOSFET device, and said method of operation further comprises the steps of:

operating a bias circuit to generate a reference voltage that is not more than a breakdown threshold voltage, Vt, below a maximum signal level on an input signal line; and applying said reference voltage is applied to at least one of a gate, a drain, a source and a bulk connection of said at least one p-type MOSFET device such that none of a first voltage difference between said gate and said drain, a second voltage difference between said gate and said source, and a third voltage difference between said gate and said bulk connection is greater than said breakdown threshold voltage, Vt.

10. The method of operating the test multiplexer for over voltage protection as set forth in claim 9 further comprising the step of applying said reference voltage to at least one of another gate, another drain, another source and another bulk connection of said at least one n-type MOSFET device such that none of a first voltage difference between said another gate and said another drain, a second voltage difference between said another gate and said another source, and a third voltage difference between said another gate and said another bulk connection is greater than said breakdown threshold voltage, Vt.

11. The method of operating a test multiplexer for over voltage protection as set forth in claim 8 further comprising the step of sampling another input signal that one of enables and disables said test multiplexer.

12. For use in integrated circuitry, a test multiplexer having over voltage protection circuitry capable of sampling a first input signal on a first input signal line, said test multiplexer comprising:

at least one p-type MOSFET device and at least one n-type MOSFET device that cooperate to pass said first input signal to an output signal line of said test multiplexer; and a bias circuit that operates to generate a reference voltage that is not more than a breakdown threshold voltage, Vt, below a maximum signal level on said first signal line, wherein said reference voltage is applied to at least one of a gate, a drain, a source and a bulk connection of said at least one p-type MOSFET device such that none of a first voltage difference between said gate and said drain, a second voltage difference between said gate and said source, and a third voltage difference between said gate and said bulk connection is greater than said breakdown threshold voltage, Vt.

13. The test multiplexer for use in integrated circuitry as set forth in claim 12 wherein said reference voltage is applied to at least one of another gate, another drain, another source and another bulk connection of said at least one n-type MOSFET device such that none of a first voltage difference between said another gate and said another drain, a second voltage difference between said another gate and said another source, and a third voltage difference between said another gate and said another bulk connection is greater than said breakdown threshold voltage, Vt.

14. The test multiplexer for use in integrated circuitry as set forth in claim 12 wherein said bias circuit comprises a plurality of p-type MOSFET devices connected in series.

15. The test multiplexer for use in integrated circuitry as set forth in claim 12 further comprising a second input signal line and wherein said voltage protection circuitry is capable of sampling a second input signal that one of enables and disables said test multiplexer.

16. The test multiplexer for use in integrated circuitry set forth in claim 15 wherein said voltage protection circuitry is further operable to disable said bias circuit in response to said sampled second input signal enabling said test multiplexer.

17. A method of operating a test multiplexer for over voltage protection in integrated circuitry, said method comprising the steps of:

sampling input signals on at least one input signal line of said test multiplexer;

cooperatively passing, when said test multiplexer is enabled, a first input signal to an output signal line of said test multiplexer using at least one p-type MOSFET device and at least one n-type MOSFET device; and operating a bias circuit, when said test multiplexer is disabled, to (i) generate a reference voltage that is not more than a breakdown threshold voltage, Vt, below a maximum signal level on said at least one input signal line, and (ii) applying said reference voltage to at least one of a gate, a drain, a source and a bulk connection of said at least one p-type MOSFET device such that none of a first voltage difference between said gate and said drain, a second voltage difference between said gate and said source, and a third voltage difference between said gate and said bulk connection is greater than said breakdown threshold voltage, Vt.

18. The method of operating a test multiplexer for over voltage protection set forth in claim 17 wherein said reference voltage is applied to at least one of another gate, another drain, another source and another bulk connection of said at least one n-type MOSFET device such that none of a first voltage difference between said another gate and said another drain, a second voltage difference between said another gate and said another source, and a third voltage difference between said another gate and said another bulk connection is greater than said breakdown threshold voltage, Vt.

19. The method of operating a test multiplexer for over voltage protection set forth in claim 17 further comprising the step of sampling a second input signal that one of enables and disables said test multiplexer.

20. The method of operating a test multiplexer for over voltage protection set forth in claim 19 further comprising the step of disabling said bias circuit in response to said sampled second input signal enabling said test multiplexer.

* * * * *